(12) United States Patent
Torng et al.

(10) Patent No.: US 10,230,045 B2
(45) Date of Patent: Mar. 12, 2019

(54) PROCESS OF FABRICATING EMBEDDED SPIN TRANSFER TORQUE MEMORY FOR CELLULAR NEURAL NETWORK BASED PROCESSING UNIT

(71) Applicant: Gyrfalcon Technology Inc., Milpitas, CA (US)

(72) Inventors: Chyu-Jiuh Torng, Dublin, CA (US); Qi Dong, San Jose, CA (US); Lin Yang, Milpitas, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 14 days.

(21) Appl. No.: 15/642,076

(22) Filed: Jul. 5, 2017

(65) Prior Publication Data

US 2018/0309050 A1    Oct. 25, 2018

Related U.S. Application Data

(60) Provisional application No. 62/488,197, filed on Apr. 21, 2017.

(51) Int. Cl.
*H01L 43/12* (2006.01)
*H01L 27/22* (2006.01)
(Continued)

(52) U.S. Cl.
CPC .............. *H01L 43/12* (2013.01); *G06N 3/061* (2013.01); *G06N 3/08* (2013.01); *G11C 11/161* (2013.01);
(Continued)

(58) Field of Classification Search
CPC . H01L 27/105; H01L 27/222; H01L 21/3105; H01L 21/76224
See application file for complete search history.

(56) References Cited

U.S. PATENT DOCUMENTS 7,884,433 B2   2/2011   Zhong et al.
8,183,061 B2   5/2012   Zhong et al.
(Continued)

OTHER PUBLICATIONS

Kodzuka, M. et al., "Effects of boron composition on tunneling magnetoresistance ratio and microstructure of CoFeB/MgO/CoFeB pseudo-spin-valve magnetic tunnel junctions" J. Appl. Phys. 111, 043913 (2012) (4 pages).
(Continued)

*Primary Examiner* — Seahvosh Nikmanesh
(74) *Attorney, Agent, or Firm* — Brinks Gilson & Lione

(57) ABSTRACT

Systems and methods for forming embedded memory in a processing unit. The methods include: depositing a dielectric layer on a metal landing pad of a logic circuit of a processing unit; opening vias in the dielectric layer; filling in the vias; performing chemical mechanical polishing (CMP); depositing an adhesion and topography planarization (ATP) layer; etching away portions of the ATP layer; filling in with inter layer dielectric (ILD) materials; performing CMP; depositing a MTJ film layer; patterning and etching away portions of the MTJ film layer; filling in with dielectric materials; performing CMP; and forming a bit line on the top layer. The methods may also include annealing in a forming gas during different steps of the above processed to reduce the high stress from the making of multi-metal layers of the processing unit at high temperature. This may prevent wafer warpage and/or significant topography in the fabrication process.

26 Claims, 8 Drawing Sheets

(51) Int. Cl.

| | |
|---|---|
| *H01L 21/3105* | (2006.01) |
| *H01L 21/762* | (2006.01) |
| *H01L 27/105* | (2006.01) |
| *H01F 10/32* | (2006.01) |
| *G11C 11/16* | (2006.01) |
| *G06N 3/06* | (2006.01) |
| *H01L 27/06* | (2006.01) |
| *H01L 23/535* | (2006.01) |
| *H01L 43/08* | (2006.01) |
| *H01L 23/528* | (2006.01) |
| *H01L 43/02* | (2006.01) |
| *H01L 23/532* | (2006.01) |
| *H01L 23/522* | (2006.01) |
| *H01L 21/768* | (2006.01) |
| *H01L 21/321* | (2006.01) |
| *G06N 3/08* | (2006.01) |

(52) U.S. Cl.
CPC ....... *H01F 10/329* (2013.01); *H01L 21/3105* (2013.01); *H01L 21/3212* (2013.01); *H01L 21/7684* (2013.01); *H01L 21/76224* (2013.01); *H01L 21/76802* (2013.01); *H01L 21/76877* (2013.01); *H01L 23/528* (2013.01); *H01L 23/5226* (2013.01); *H01L 23/535* (2013.01); *H01L 23/53257* (2013.01); *H01L 23/53295* (2013.01); *H01L 27/0688* (2013.01); *H01L 27/105* (2013.01); *H01L 27/222* (2013.01); *H01L 43/02* (2013.01); *H01L 43/08* (2013.01); *H01L 23/5329* (2013.01); *H01L 23/53228* (2013.01)

(56) References Cited

U.S. PATENT DOCUMENTS

| | | | |
|---|---|---|---|
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,673,388 B2 | 6/2017 | Toh et al. | |
| 9,685,604 B2 | 6/2017 | Huang et al. | |
| 9,959,500 B1 * | 5/2018 | Torng | G06N 3/08 |
| 2006/0011958 A1 | 1/2006 | Jeong et al. | |
| 2016/0218280 A1 | 7/2016 | Park et al. | |
| 2016/0225818 A1 | 8/2016 | Toh et al. | |
| 2016/0322090 A1 | 11/2016 | Chan et al. | |
| 2017/0040531 A1 | 2/2017 | Chung et al. | |
| 2017/0092693 A1 | 3/2017 | Tan et al. | |
| 2017/0092851 A1 | 3/2017 | Han et al. | |
| 2017/0110653 A1 | 4/2017 | Seo et al. | |
| 2017/0125666 A1 | 5/2017 | Han et al. | |
| 2017/0148979 A1 | 5/2017 | Kim et al. | |
| 2017/0324025 A1 | 11/2017 | Lee et al. | |

OTHER PUBLICATIONS

Kültürsay E. et al., "Evaluating STT-RAM as an Energy-Efficient Main Memory Alternative," 2013 IEEE International Symposium on Performance Analysis of Systems and Software (Apr. 23, 2013) Austin, Texas (12 pages).

Sze, V. et al., "Hardware for Machine Learning: Challenges and Opportunities," Massachusetts Institute of Technology, Cambridge, MA, Invited Paper, Dec. 2016, available at https://arxiv.org/pdf/1612.07625.pdf (8 pages).

Thomas, L. et al., "Basic Principles, Challenges and Opportunities of STT-MRAM for Embedded Memory Applications," MSST 2017, Santa Clara, CA, May 2017 (30 pages).

Thomas, L. et al. "Perpendicular STT-MRAM with high spin torque efficiency and thermal stability for embedded applications," J Appl Phys. 2014;155(17):172615 (25 pages).

Zhao, W et al., "Design of MRAM based Logic Circuites and its Applications," Conference: Proceedings of the 21st ACM Great Lakes Symposium on VLSI 2010, Lausanne, Switzerland, May 2-6, 2011 (6 pages).

Information about Related Patents and Patent Applications, see section 6 of the accompanying Information Disclosure Statement Letter, which concerns Related Patents and Patent Applications.

* cited by examiner

PROCESS OF FABRICATING EMBEDDED SPIN TRANSFER TORQUE MEMORY FOR CELLULAR NEURAL NETWORK BASED PROCESSING UNIT

RELATED APPLICATIONS

This patent application claims priority to U.S. Provisional Patent Application No. 62/488,197 filed Apr. 21, 2017, the disclosure of which is incorporated herein by reference in full.

FIELD

This patent document relates generally to the spin transfer torque (STT) memory and methods of making the same. More particularly, the present document relates to embedded STT memory in a processing unit and methods of making the same.

BACKGROUND

Some integrated circuit (IC) chips nowadays include embedded or on-chip memory (e.g., SRAM) inside the processing unit due to the increased demand of processing speed and memory space. For example, a processing unit that has machine learning capabilities may need to embed a cellular neural network (CNN) that includes multiple layers and hundreds or thousands of cells. This requires the processing unit to have embedded memory large and fast enough to handle frequent reading and/or writing of data associated with machine learning computations. It is also desirable to embed in the processing unit memory of high density, long endurance and fast access speed with lower power consumption.

STT memory, such as STT-MRAM, is an enabling non-volatile memory solution for achieving fast access (read/write) speed and small cell size with lower power consumption. However, embedding an STT memory inside a processing unit faces some challenges. For example, one way to make the embedded memory inside the processing unit is to build the memory on top of the last metal substrate of the logic circuit of the processing unit. Yet, the high stress from the making of multi-metal layers of the processing unit at a high temperature (usually at 400° C.) may cause wafer warpage and/or significant topography, which may result in memory yield loss and device performance degradation.

Another challenge in the making of embedded STT-RAM (such as STT-MRAM with magnetic tunnel junction (MTJ)) is the adjustable thermal treatment that is required to match MTJ materials for better performance. For example, for perpendicular magnetic anisotropy (PMA) STT, the free layer of MTJ may preferably use a film of lower B composition of $Co_xFe_yB_z$. Films with lower B can result in structure matching to MgO during post-low temperature annealing. This structure matching is important for better PMA interface (for higher device thermal stability) and faster memory read (higher MR) for better reading. Typically, a post-annealing at a temperature of about 300 to 360° C. is required for low B films for 1 to 2 hours. However, the making of an embedded IC process will be at about 400° C., which requires high B composition due to B diffuse out. This results in lower MR and low device thermal stability.

Another challenge in the making of embedded STT-RAM is the surface roughness during the film growth or other fabrication processes and a need for controlling the surface smoothness. In making an embedded memory, a smooth surface before MTJ deposit is very critical for film growth and film properties. MTJ film to dielectric film adhesion is also important in preventing peeling during IC manufacturing processes.

SUMMARY

The present disclosure relates to systems and methods of forming embedded memory in a processing unit. In some scenarios, a method includes: (i) depositing a dielectric layer having a first surface on a metal landing pad of a logic circuit of a processing unit; (ii) opening and filling vias in the dielectric layer to form a second surface on top of the dielectric layer; (iii) performing chemical mechanical polishing (CMP) on the second surface using a high selectivity slurry until the first surface is exposed; (iv) depositing an adhesion and topography planarization (ATP) layer on the second surface; (v) etching away portions of the ATP layer; (vi) filling in the etched portions with inter layer dielectric (ILD) materials to form a third surface on top of the ATP layer; (vii) performing CMP on the third surface until the second surface is exposed; (viii) depositing an MTJ film layer on the third surface; (ix) patterning and etching away portions of the MTJ film layer; (x) filling in the etched portions with dielectric materials to form a fourth surface on top of the MTJ film layer; (xi) performing CMP on the fourth surface until the third surface is exposed; and (xii) forming a bit line on the fourth surface.

In some scenarios, the method also includes: depositing a passivation layer on the bit line; forming a bond pad on the passivation layer; and performing a first annealing after forming the bond pad. In those or other scenarios, the method further includes annealing in a forming gas after step (i) and before step (ii). Alternatively or additionally, the method includes annealing in a forming gas after step (iv) and before step (v). The above steps (ii)-(xii) may be performed in a low temperature range of greater than 200° C. and lower than 400° C.

Various materials may be used in the dielectric layers illustrated above, and various methods may be used to etch away and fill vias. In some scenarios, the ATP layer includes multiple layers. For example, the ATP layer includes a top layer made of WN, CrN, TiN, TaN, or NiCrN, and a bottom layer made of Ta, Nb, Ti, Zr, Hf, Mg, Cr, Zn, Al, TaN, W, or TiN. Additionally, patterning and etching away the portions of the MTJ film layer includes patterning a photoresist layer on the MTJ film layer and hard masking the photoresist layer to form a pattern that includes an array of MTJ elements. The sizes of the MTJ elements in the array may be the same or may be different to allow for the making of different types of memory in a single chip.

The above illustrated methods may also have variations. For example, a method of forming embedded memory in a processing unit includes: (i) depositing an dielectric layer having a first surface on a metal landing pad of a logic circuit of a processing unit; (ii) opening vias in the dielectric layer; (iii) filling in the vias in the dielectric layer to form a second surface on top of the dielectric layer; (iv) performing chemical mechanical polishing (CMP) on the second surface using a high selectivity slurry until the first surface is exposed; (v) depositing a MTJ film layer on the second surface; (vi) patterning and etching away portions of the MTJ film layer; (vii) filling in with dielectric materials to form a third surface on top of the MTJ film layer; and (viii) performing CMP on the third surface until the second surface is exposed; and (ix) forming a bit line on the fourth surface.

Alternatively or additionally, a method of forming embedded memory in a processing unit includes: (i) depositing an dielectric layer having a first surface on a metal landing pad of a logic circuit of a processing unit; (ii) annealing in a forming gas; (iii) opening vias in the dielectric layer; (iv) filling in the vias in the dielectric layer to form a second surface on top of the dielectric layer; (v) performing chemical mechanical polishing (CMP) on the second surface using a high selectivity slurry until the first surface is exposed; (vi) depositing an adhesion and topography planarization (ATP) layer on the second surface; (vii) depositing a MTJ film layer on the ATP layer; (viii) patterning and etching away portions of the MTJ film layer through the ATP layer until the second surface; (ix) filling in with dielectric materials to form a third surface a top surface of the MTJ film layer; (x) performing CMP on the third surface until the top surface of the MTJ film layer is exposed; and (xi) forming a bit line on the fourth surface.

BRIEF DESCRIPTION OF THE DRAWINGS

The present solution will be described with reference to the following drawing figures, in which like numerals represent like items throughout the figures.

DETAILED DESCRIPTION

It will be readily understood that the components of the present solution as generally described herein and illustrated in the appended figures could be arranged and designed in a wide variety of different configurations. Thus, the following more detailed description of various implementations, as represented in the figures, is not intended to limit the scope of the present disclosure, but is merely representative of various implementations. While the various aspects of the present solution are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment thereof. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to." Unless defined otherwise, all technical and scientific terms used in this document have the same meanings as commonly understood by one of ordinary skill in the art.

Figure 1:
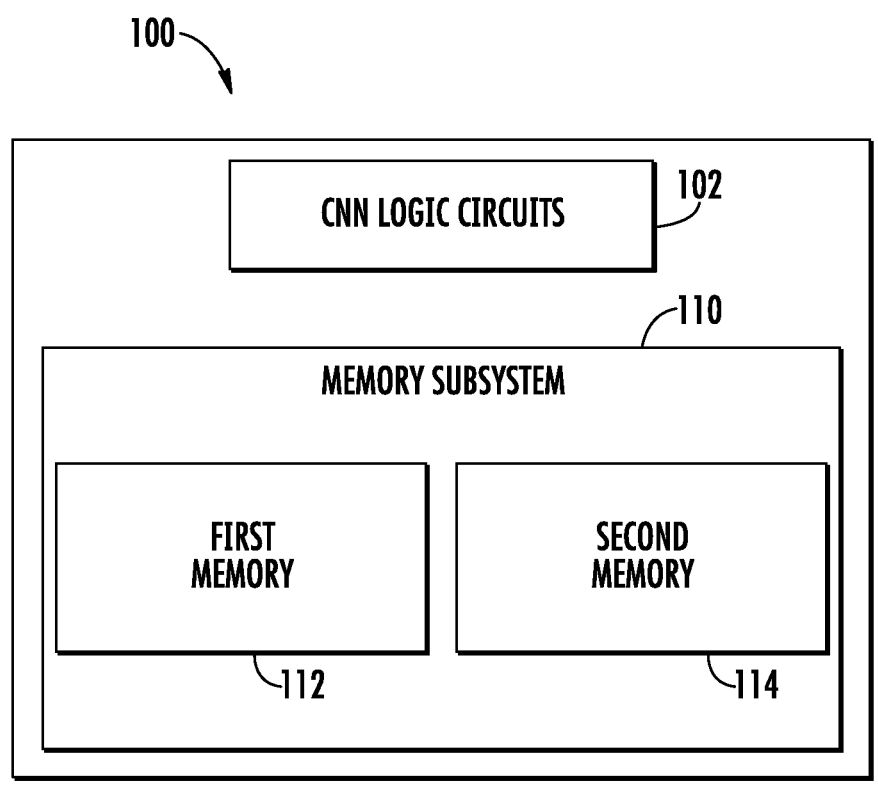
FIG. 1 provides a diagram of at least a portion of a processing unit that is useful for understanding the present solution.

With reference to FIG. 1, a processing unit 100 includes a logic circuit 102 that has high complex computational capabilities (e.g. machine learning capabilities). For example, the logic circuit 102 is a cellular neural network (CNN) logic circuit. The processing unit 100 also includes an embedded memory subsystem 110. The embedded memory 110 may be used by the processing unit 100 to accommodate various computational tasks. The memory system may have various types, such as first memory 112 and second memory 114, to accommodate different memory access needs associated with the use of the logic circuit of the processing unit. For example, the first memory may be an SRAM memory that has the advantages of high endurance and fast access time, which can be adequate for applications that require frequent reading of data from sensors and saving sensor data in the memory. The second memory may be a flash memory that has the advantages of longer data retention rate and is suitable for storing parameters that need to be frequently read by applications but do not require frequent write. Examples of such parameters include parameters of convolutional neural networks in machine learning computations.

Figure 2:
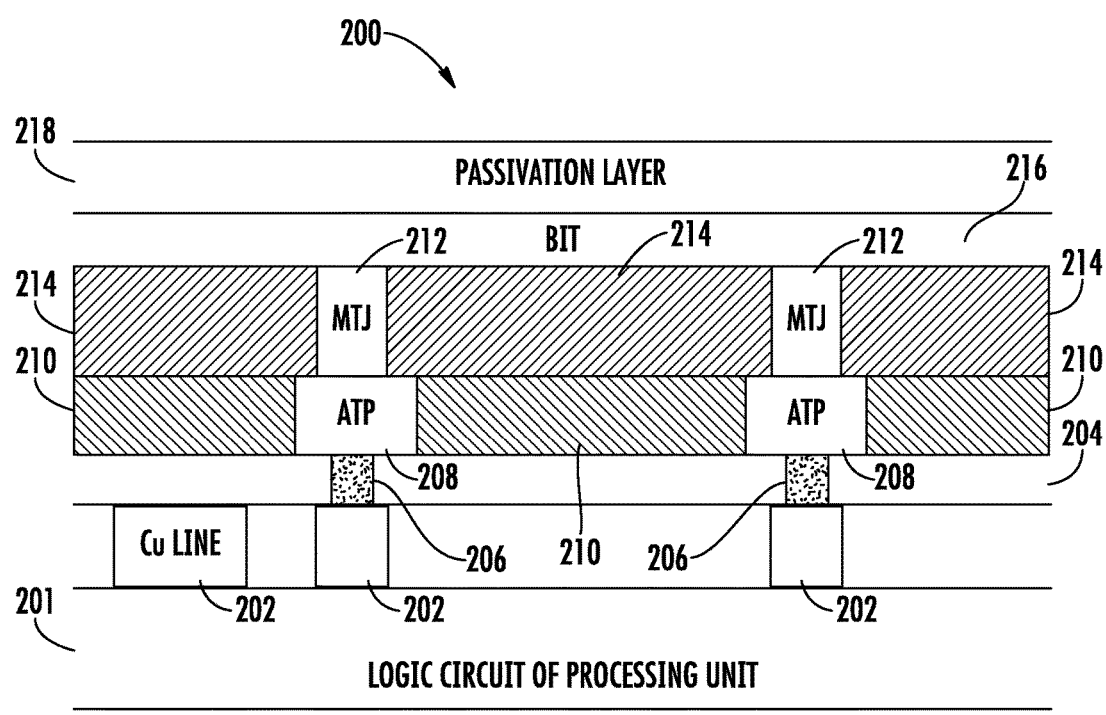
FIG. 2 provides a diagram of a cross section of an embedded STT memory that is useful for understanding the present solution.

In FIG. 2, an integrated circuit processor 200 includes a processing unit having a logic circuit 201. An embedded memory is built on a metal landing pad 202, or the top metal layer (i.e. the last metal layer) of the logic circuit 201. In some scenarios, an embedded STT memory includes a dielectric layer 204 deposited on the metal landing pad 202 of the logic circuit of the processing unit. This metal landing pad is the last metal layer before the bit line of the logic circuit that has transistors. In other words, the embedded memory is sandwiched between the bit line of the logic circuit and the last metal layer under which the remaining structure of the logic circuit is laid. The metal landing pad can be made of any suitable metal, such as copper (Cu). The dielectric layer may be made of SiCN, SiCN/SiO, SiCN/SiN or SiN/SiO. The dielectric layer may have a thickness in the range from 300 A to 3000 A. The dielectric layer 204 has one or more vias, through which the layer disposed on top of the dielectric layer is in electrical contact with the metal landing pad 202. This will be further explained below.

In some scenarios, the embedded STT memory may further include one or more adhesion and topography planarization (ATP) pads in an ATP layer 208 that is disposed on the dielectric layer 204 and sandwiched between a MTJ layer 212 and the dielectric layer 204. In the manufacturing of the STT memory, the surface roughness resulting from film growth and film property is of particular challenge for depositing a MTJ to a dielectric layer. Such depositing process requires a smooth surface on the dielectric layer because surface roughness may affect the adhesion between the MTJ film and dielectric film and further cause peeling during IC manufacturing processes. The additional ATP layer 208 may help resolve the surface roughness issue. Optionally, the ATP layer 208 may be planarized (such as through chemical mechanically polishing (CMP)), to provide a smooth surface for depositing the MTJ layer 214. This process may help provide a better adhesion between the MTJ layer 212 and the dielectric layer 204.

The ATP layer 208 may include multilayer films. The total thickness of the ATP layer may be in the range from 500 A (to allow for adequate margin for CMP process) to 4000 A (to allow for etching margin, or dense pitch). In some scenarios, the ATP layer 208 includes at least two layers or films stacked together. The bottom layer is made of WN, CrN, TiN, TaN, or NiCrN. The top layer is made of materials that have an electronegativity less than a threshold so that the top layer exhibits slow speed in an etching process and serves as an etch stop layer to control over-etch when etching the MTJ layer 212, which will be explained later in this document.

The electronegativity threshold for the top layer of the ATP layer may be about 1.66. The examples of materials that have electronegativity less than this threshold include Ta, Nb, Ti, Zr, Hf, Mg, Cr, Zn, Al, TaN, W, or TiN. Depending on the process used in etching the MTJ layer, the materials of the top layer of the ATP layer 208 may vary. For example, if the MTJ layer is etched using reactive-ion etching (RIE) (such as using CH3OH, CO/NH3, CH3OH/Ar or CO/NH3/Ar chemistry), then the materials of the top layer of the ATP layer may be Ta, Nb, Ti, Zr, TaN or TiN. If the MTJ layer is etched using Argon (Ar) only plasma, or RIE and Ar only plasma etching, then lower Ar sputter yield materials are preferred for the top layer of the ATP layer. In such a case, the top layer of the ATP layer may be Ta, Nb, Ti, Zr, W, TaN or TiN. As shown above, some of the materials used for the top layer may be the same as that used for the bottom layer of the ATP layer. In that case, the ATP layer may be a single layer made of the same material.

The ATP layer may be in electrical contact with the metal landing pad through one or more vias 206 in the dielectric layer 204. The fillings in the one or more vias 206 may be made of conductive materials, such as TiN, TaN, or Ta. These materials may be deposited in the one or more vias using known processes such as PVD, CVD, or ALD. Alternatively, the vias in the dielectric layer may be copper single damascene vias that allow copper to be in contact with at least a portion of the metal landing pad 202.

The ATP layer 208 may be etched and filled with materials 210 (inter layer dielectric, or ILD) in the etched portions. The materials 210 may be dielectric materials such as SiO, SiN, SiCN or a combination thereof. The MTJ layer 212 may include a tunnel layer sandwiched between a pined layer and a free layer. The free layer of the MTJ layer may be made of $Co_xFe_yB_z$, $Fe_xB_y/Co_xFe_yB_z$, $Co_xFe_yB_z/Co_xFe_yB_z$, $Co_xFe_yB_z/M/Co_xFe_yB_z$, $Fe_xB_y/M/Fe_xB_y$, or $Fe_xB_y/Co_xFe_yB_z/M/Co_xFe_yB_z$, wheren M is metal. The MTJ layer may be etched and filled with dielectric materials 214. The materials 214 may be dielectric materials similar to those dielectric materials 210 used in the ATP layer 208, such as SiO, SiN, SiCN or a combination thereof.

The STT memory also includes a bit layer 216 formed on top of the MTJ layer 212, such as the free layer of the MTJ layer. Additionally, or alternatively, the STT memory may include a passivation layer 218 and a bond pad (not shown), as known in the IC industry.

Figure 3:
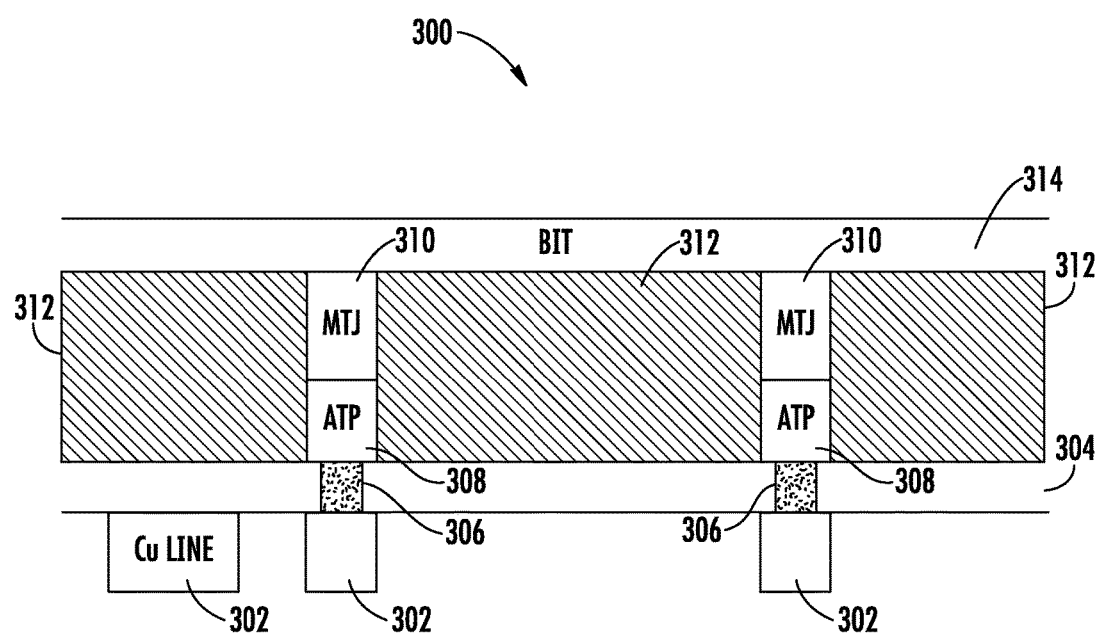
FIG. 3 provides a diagram of a cross section of an embedded STT memory that is useful for understanding the present solution.

The ATP layer 208 that is sandwiched between the MTJ layer 212 and the dielectric layer 204 may include one or more ATP pads formed by etching Similarly, the MTJ layer 212 also includes one or more MTJ bits formed by etching. In some scenarios, the size of the ATP pads is larger than that of the MTJ bits, as shown in FIG. 2. As explained, the structure of ATP layer 208 and MTJ layer 212 is formed by two etching processes, one for ATP layer and one for MTJ layer. In other scenarios, the size of the ATP pad(s) is the same as that of the MTJ bit(s), as shown in FIG. 3. With further reference to FIG. 3, when the ATP pad(s) and MTJ bit(s) are of the same size, the trenches 312 between the MTJ bit(s) and the ATP pad(s) may be formed by a single etching process.

The above illustrated STT memory structure may be suitable for various applications, in which the logic circuit of the processing unit is configured to use at least data read from the bit line to perform computations. In some scenarios, the illustrated STT memory may be configured to be suitable for a processing unit that has machine learning capabilities, which may require memory of different types in terms of endurance, data retention and access speed. For example, in FIGS. 4A and 4B, the MTJ layer may include one or more sub-arrays such as 411, 412, 451, 452, each of which may include one or more MTJ bits having different sizes (e.g. 421, 422) or different spacing (e.g. 420, 461, 462) between adjacent bits. This will enable memory of different types for different computation needs to be fabricated in the same processing unit, as shown in FIG. 1 (first and second memory).

Figure 5:
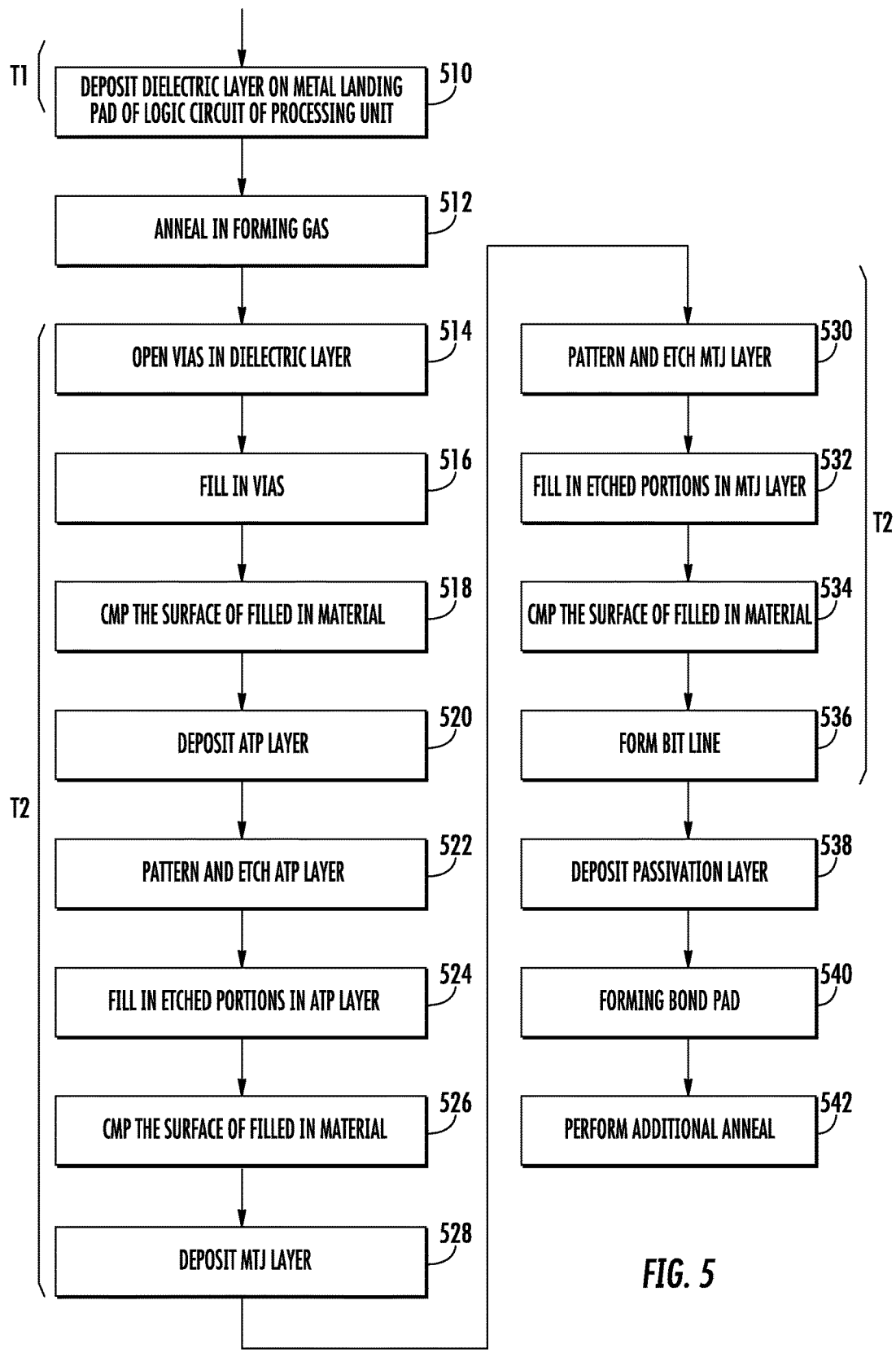
FIGS. 5-8 provide diagrams of various fabrication processes of embedded STT memory that is useful for understanding the present solution.

The above illustrated STT memory can be fabricated with various fabrication processes. In FIG. 5, a method for forming an embedded memory in a processing unit includes depositing an dielectric layer on a metal landing pad of a logic circuit of a processing unit 510, where the dielectric layer has a first surface. The dielectric layer may be made of SiCN, SiCN/SiO, SiCN/SiN or SiN/SiO. The thickness of the dielectric layer may be in a range from 300 A to 3000 A. This process may be performed in a high temperature range T1 as used in making the logical circuit of the processing unit below the metal landing pad (202 in FIG. 2). In some scenarios, the range of temperature T1 may be about 400° C.

The method may further include performing annealing in forming gas 512. This process may allow subsequent fabrication processes to be performed in a lower temperature range T2, such as a range of greater than 200° C. and lower than 400° C. in comparison to the higher temperature range T1. Preferably, the processing temperature T2 may be between 200° C. and 360° C. The annealing 512 may be performed at about 400° C. for about 30 minutes. Subsequent processes in the fabrication may be performed in 400° C. or less. For example, subsequent fabrication processes may be performed in 200° C.-360° C. for 1-2 hours. The annealing process may help ease the stress and have better interface quality for the transistor underneath (e.g., the logical circuit of the processing unit). The annealing will also reduce the thermal burden to MTJ that is resulted from the making of the logical circuit, and thus prevent memory yield loss or device performance degradation. The annealing 512 may also help the MTJ layer to achieve certain characteristics for better structure matching, for example, to match thermal requirement per MTJ materials selected (e.g., the MTJ may be matched to have the highest MR for better reading margin).

After annealing in forming gas 512, the method may further include opening vias in the dielectric layer 514. This may use any known or later developed etching process. The dielectric layer has a top surface (or first surface). The method further includes filling in the vias in the dielectric layer 516 to cover the first surface of the dielectric layer and to form a second surface. The method further includes performing chemical mechanical polishing (CMP) on the second surface 518 until the first surface is exposed. The filling of the vias may include depositing TiN, TaN, or Ta. The depositing of the materials in the vias may include using PVD, CVD, or ALD. Alternatively, and/or additionally, the method may include forming a Cu single damascene to be in contact with at least a portion of the metal landing pad underneath the dielectric layer. In some scenarios, the CMP process applied to the second surface may include dispensing a high selectivity slurry so that the rate of polishing may become even when a polished surface includes different materials, such as dielectric materials and the fillings in the vias of the dielectric layer.

The method may further include depositing an ATP layer 520 on the polished second surface. The ATP layer may include multilayer films, such as the two layers described above. The total thickness of the ATP layer may be in the range from 500 A to 4000 A. The bottom layer may be made of WN, CrN, TiN, TaN, or NiCrN. The top layer may be made of materials having electronegativity less than a threshold, such as 1.66. For example, the top layer may be made of Ta, Nb, Ti, Zr, Hf, Mg, Cr, Zn, Al, TaN, W, or TiN.

The material of the top layer of the ATP layer may depend on the etching process to be used in the MTJ layer on top of the ATP layer, which will be explained later in this document. The method may also include patterning and etching away portions of the ATP layer 522, filling in with inter layer dielectric (ILD) materials 524 to cover the ATP layer and form a third surface on top of the ATP layer. The method may further include performing CMP on the third surface 526 until the ATP layer is exposed. The ILD materials may be SiO, SiN, SiCN or a combination thereof. The thickness of the ILD materials may be in the range from 1000 A to 5000 A. The CMP process may also dispense high selectivity slurry to reduce the wafer topography and smoothen the ATP surface for better depositing of MTJ film, which will be further explained.

The method further includes depositing a MTJ film layer. The MTJ film layer includes a tunnel layer sandwiched between a pinned layer at the bottom and a free layer on the top. The free layer may be made of $Co_xFe_yB_z$, $Fe_xB_y$, $Fe_xB_y/Co_xFe_yB_z$, $Co_xFe_yB_z/Co_xFe_yB_z$, $Co_xFe_yB_z/M/Co_xFe_yB_z$, $Fe_xB_y/M/Fe_xB_y$, or $Fe_xB_y/Co_xFe_yB_z/M/Co_xFe_yB_z$, wherein M is metal. In some scenarios, the method may include depositing the MTJ film layer on the polished third surface 528, patterning and etching away portions of the MTJ film layer 530, filling in with dielectric materials 532 to cover the MTJ film layer to form a fourth surface on top of the MTJ film layer, and performing CMP on the fourth surface 534 until the MTJ film layer is exposed. In etching the MTJ film layer, the top of the ATP layer may act as a etch stop layer to control over-etch. In those and other scenarios, the top layer of the ATP layer may be made of Ta, Nb, Ti, Zr, TaN or TiN, and the etching of the MTJ layer may use RIE with CH3OH, CO/NH3, CH3OH/Ar or CO/NH3/Ar chemistry, so that the top layer of the ATP layer may act as an etch stop layer. In those and other scenarios, the top layer of the ATP layer may be made of Ta, Nb, Ti, Zr, W, TaN or TiN, and the etching of the MTJ layer may use Ar only plasma, or RIE and Ar only plasma etching, so that the top layer of the ATP layer may act as an etch stop.

Figure 4A:
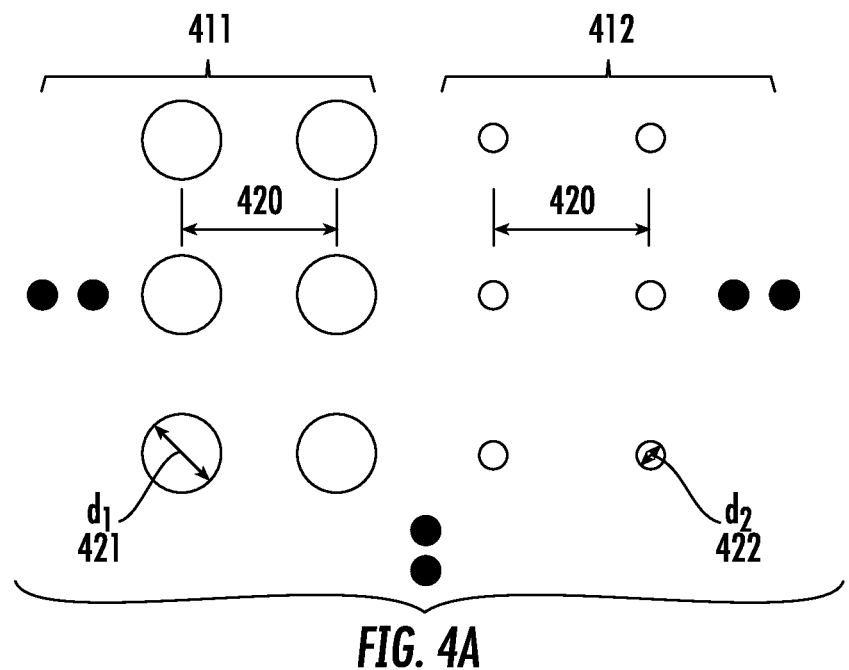
FIGS. 4A-4B (collectively referred to herein as "FIG. 4") provide diagrams of layout of MTJ bits in an embedded STT memory that is useful for understanding the present solution.
Figure 4B:
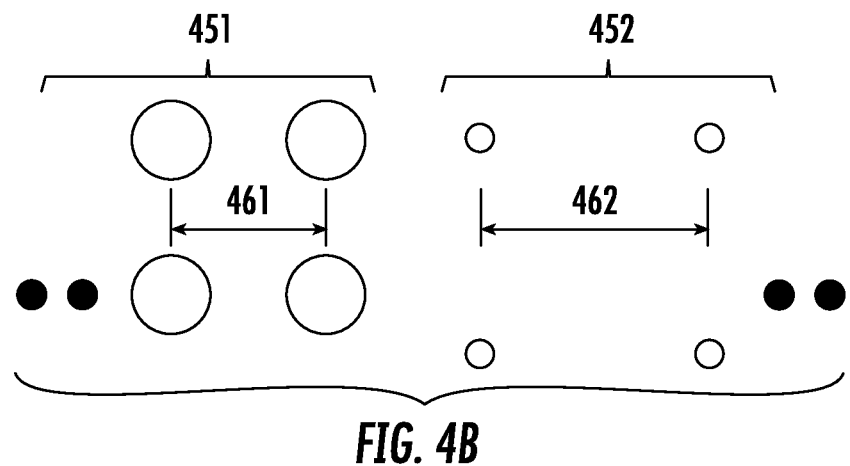

Patterning and etching of the MTJ film layer may include patterning a photoresist layer on the MTJ film layer and hard masking the photoresist layer to form a pattern that includes an array of MTJ elements, each element having a size. In fabricating the STT memory that has MTJ bits of various sizes and spacing between adjacent MTJ pads (e.g., as shown in FIGS. 4A-4B), the patterning may be configured so that the array of MTJ elements includes a plurality of sub-arrays of MTJ elements. Each sub-array represents a type of MTJ elements and the sizes of the MTJ elements in at least two sub-arrays may be different.

With further reference to FIG. 5, the method of fabrication also includes forming one or more bit lines 536. In some scenarios, the method may include forming the bit lines on the polished fourth surface, or the top surface of the MTJ layer. In forming the bit line, the method may include depositing an dielectric material layer and performing a Cu dual damascene processing on the dielectric material layer, or other suitable method.

The method of forming the STT memory may also include depositing a passivation layer on the bit line 538, forming a bond pad 540, as may be used in conventional fabrication methods. The method may also perform an additional annealing 542 after forming the bond pad. The additional annealing may be performed in the temperature range from 200° C. to 400° C. The duration of the additional annealing may be needed or may not be needed, depending on processing temperature T2 and the time that has elapsed in the fabrication processes up to the forming of the bit line 536. In some scenarios, an additional annealing in the range of 30 minutes to 10 hours may be needed. The annealing can be any suitable annealing method, known or later developed, depending on the MTJ film and its properties/performance requirements. Once the STT memory is fabricated using the above illustrated embodiments, the logic circuit of the processing unit may be configured to use at least data that is read/write from/to the bit line to perform one or more computations in machine learning.

Figure 6:
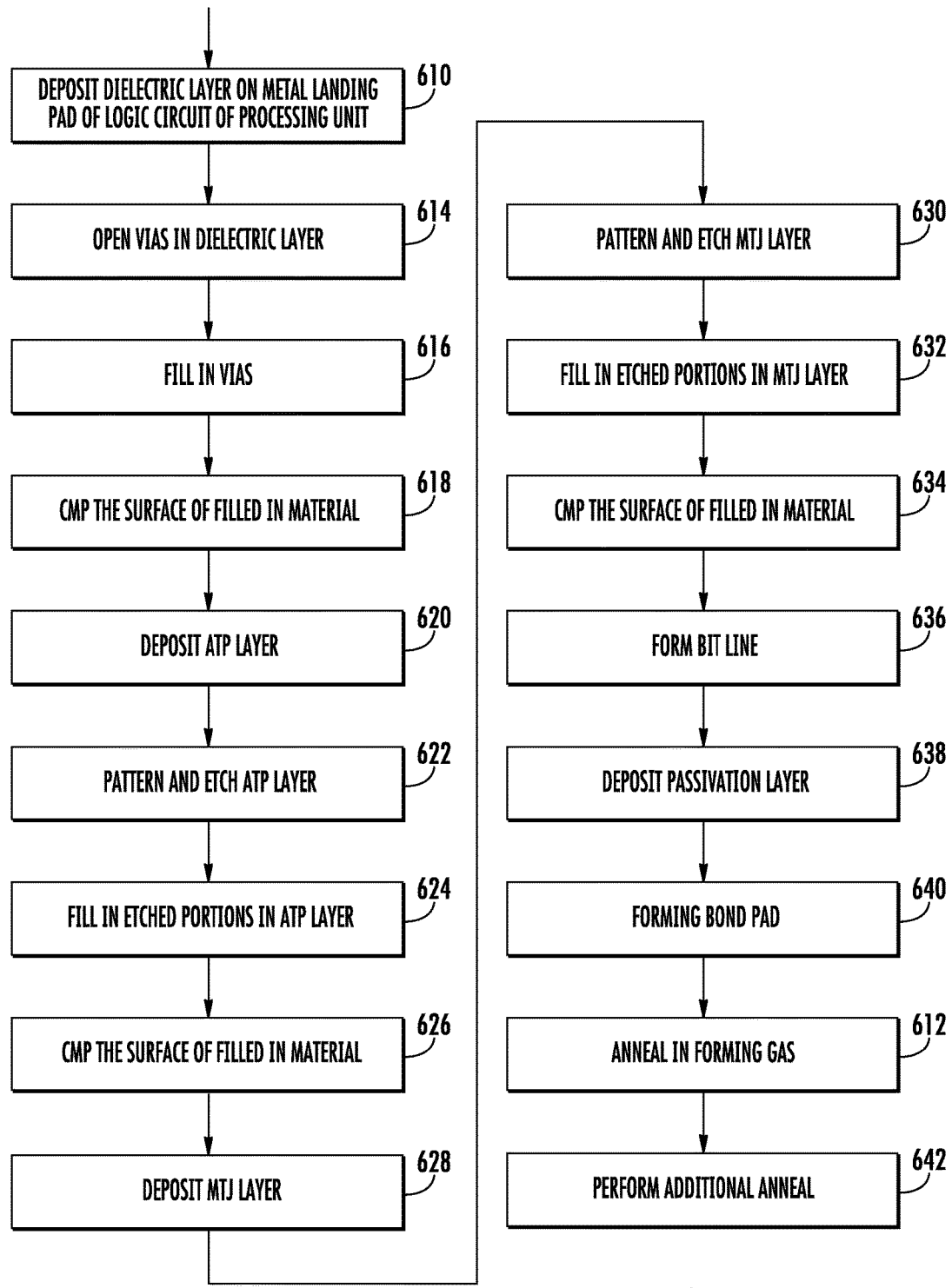

The above illustrated methods may vary while still achieving some advantages in STT embedded memory making. For example, annealing in forming gas may be performed at the end of the manufacturing process instead of before depositing the ATP layer. In FIG. 6, a method of forming a STT embedded memory includes depositing an dielectric layer on a metal landing pad of a logic circuit of a processing unit 610, where the dielectric layer has a first surface. The method may further include opening vias in the dielectric layer 614 having a first surface, filling in the vias in the dielectric layer 616 to cover the first surface of the dielectric layer and to form a second surface, and performing chemical mechanical polishing (CMP) on the second surface 618 until the first surface is exposed.

The method also includes depositing an ATP layer 620 on the second surface, patterning and etching away portions of the ATP layer 622, filling in with inter layer dielectric (ILD) materials 624 to cover the ATP layer and form a third surface on top of the ATP layer, and performing CMP on the third surface 626 until the ATP layer is exposed. The method further includes depositing a MTJ film layer on the third surface 628, patterning and etching away portions of the MTJ film layer 630, filling in with dielectric materials 632 to cover the MTJ film layer to form a fourth surface on top of the MTJ film layer, and performing CMP on the fourth surface 634 until the MTJ film layer is exposed. Additionally, the method may include forming one or more bit lines 636 on the fourth surface, or the top surface of the MTJ layer. The method may additionally include depositing a passivation layer on the bit line 638, forming a bond pad 640, as may be used in conventional chip fabrication process. After the forming of the bond pad, the method may include annealing in forming gas 612. The method may also include performing an additional annealing 642 after annealing in a forming gas. The materials and various processes of depositing, forming, opening vias, patterning, etching, and/or performing CMP may be similar to those described in FIG. 5.

Alternatively, the STT embedded memory may not need to have an ATP layer. In other words, blocks 620, 622, 624, 626 can be omitted from the fabrication methods described in FIG. 6.

Figure 7:
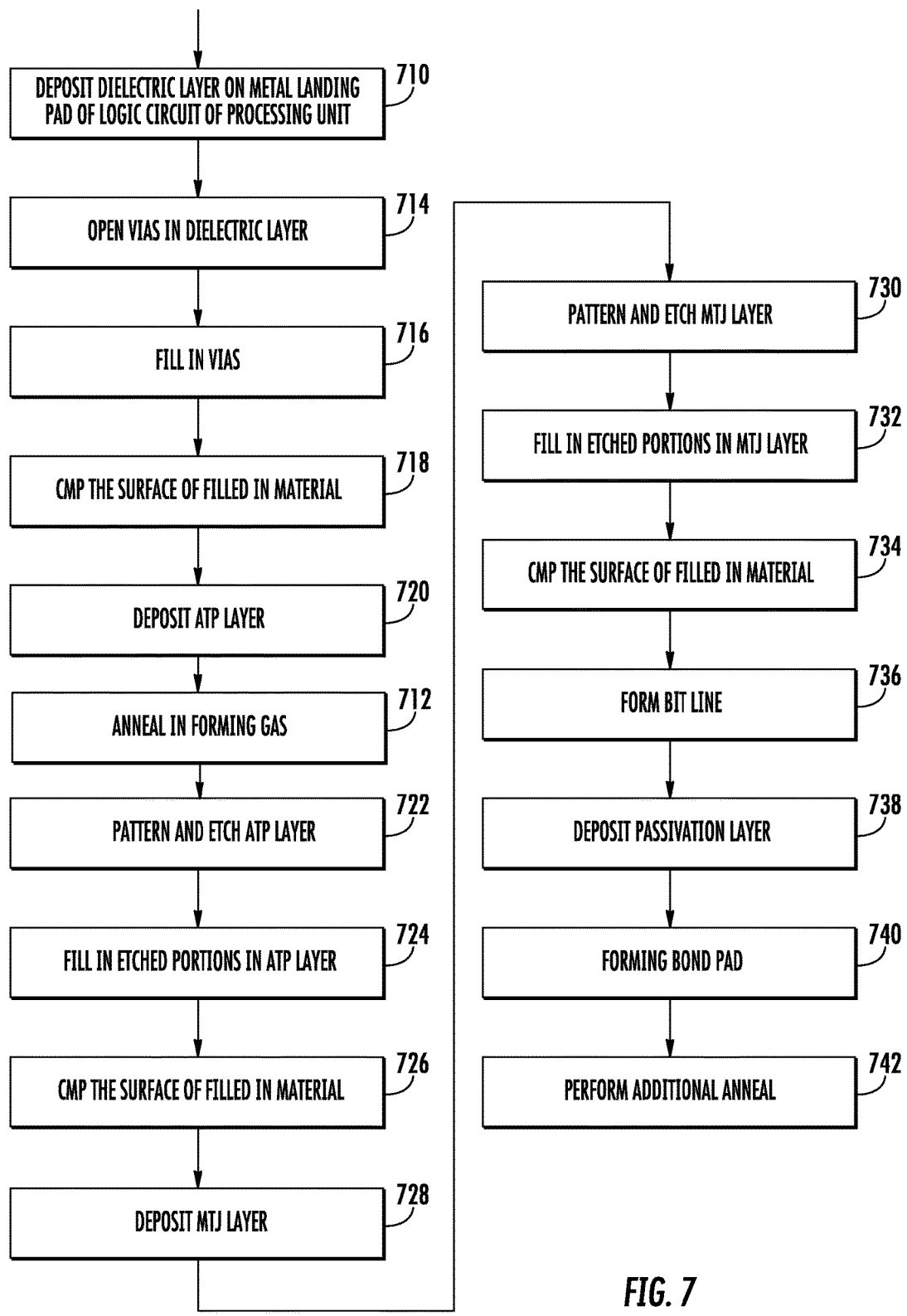

Alternatively, and/or additionally, annealing in forming gas may be performed in other stages of the fabrication process, such as after depositing the ATP layer. In FIG. 7, a method of forming an STT embedded memory includes depositing an dielectric layer on a metal landing pad of a logic circuit of a processing unit 710, where the dielectric layer has a first surface. The method may further include opening vias in the dielectric layer 714 having a first surface, filling in the vias in the dielectric layer 716 to cover the first surface of the dielectric layer and to form a second surface, and performing chemical mechanical polishing (CMP) on the second surface 718 until the first surface is exposed.

The method further includes depositing an ATP layer 720 on the second surface, annealing in forming gas 712, patterning and etching away portions of the ATP layer 722, filling in with inter layer dielectric (ILD) materials 724 to cover the ATP layer and form a third surface on top of the ATP layer, and performing CMP on the third surface 726 until the ATP layer is exposed. The method may further includes depositing a MTJ film layer on the third surface 728, patterning and etching away portions of the MTJ film layer 730, filling in with dielectric materials 732 to cover the MTJ film layer to form a fourth surface on top of the MTJ film layer, and performing CMP on the fourth surface 734 until the MTJ film layer is exposed. The method may further include forming one or more bit lines 736 on the fourth surface, or the top surface of the MTJ layer. The method may additionally include depositing a passivation layer on the bit line 738, forming a bond pad 740, as may be used in conventional fabrication of chips. After the forming of the bond pad, the method may include performing an additional annealing 742. Materials and various processes of depositing, forming, opening vias, patterning, etching, and/or performing CMP may be similar to those described in FIG. 5.

Figure 8:
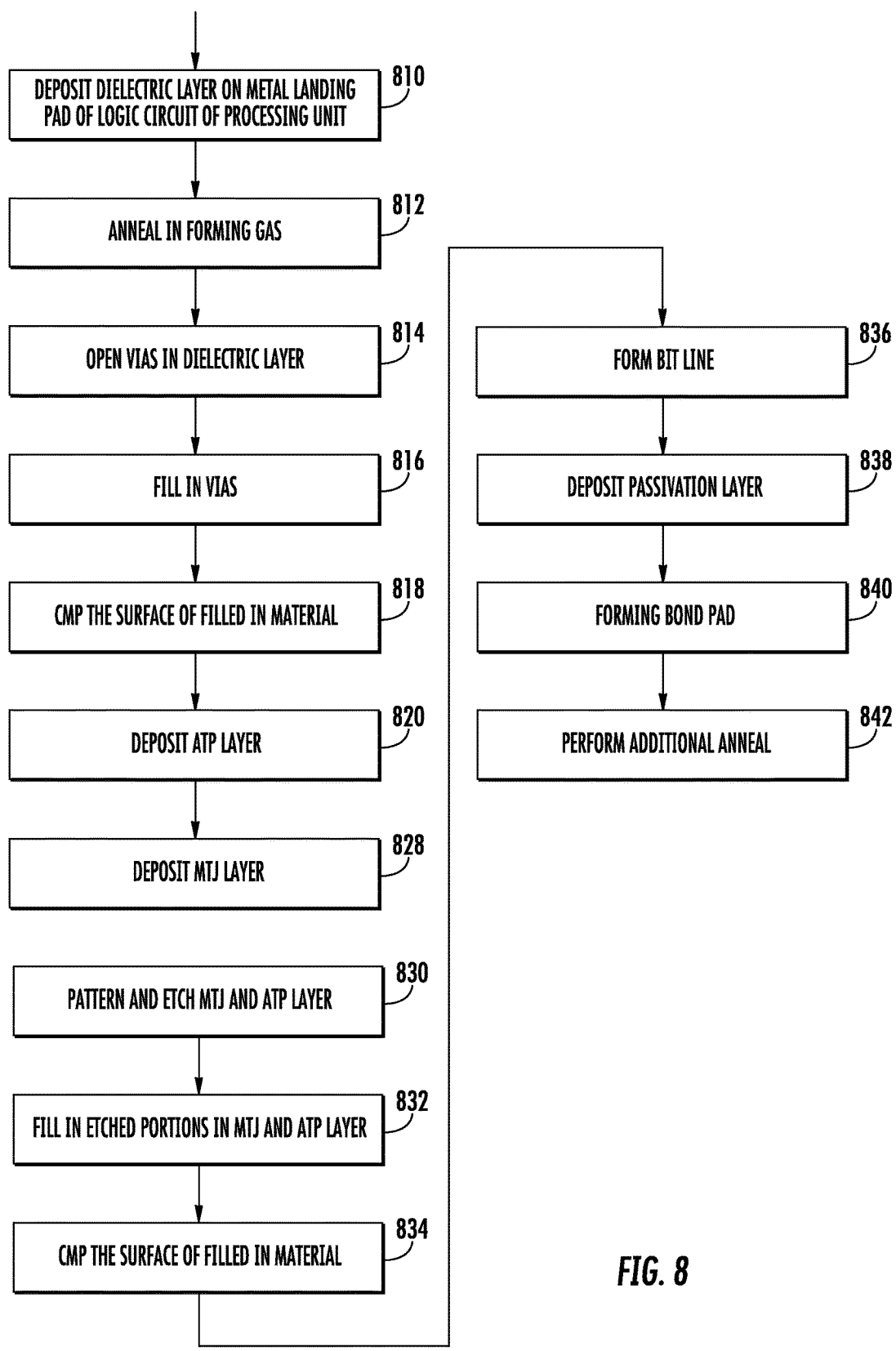

The method of fabricating an embedded memory may vary as the structure of the embedded memory changes. For example, as shown in FIG. 3 the size of MTJ bits and ATP pads in the embedded memory are of the same size. A method for fabricating such an embedded memory, as shown in FIG. 8, includes depositing an dielectric layer on a metal landing pad of a logic circuit of a processing unit 810, where the dielectric layer has a first surface. The method may further include annealing in forming gas 812, opening vias in the dielectric layer 814 having a first surface, filling in the vias in the dielectric layer 816 to cover the first surface of the dielectric layer and to form a second surface, and performing chemical mechanical polishing (CMP) on the second surface 818 until the first surface is exposed.

The method further includes depositing an ATP layer 820 on the second surface, depositing a MTJ film layer on the ATP layer 828, patterning and etching away portions of the MTJ film layer and the underneath ATP layer 830, filling in with dielectric materials 832 to cover the MTJ film layer to form a third surface on top of the MTJ film layer, and performing CMP on the third surface 834 until the MTJ film layer is exposed. In some scenarios, before depositing the MTJ film layer on the ATP layer, the method may include performing CMP on the ATP layer to smoothen the top surface of the ATP layer.

The method may further include forming one or more bit lines 836 on the third surface, or the top surface of the MTJ layer. The method may additionally include depositing a passivation layer on the bit line 838, forming a bond pad 840, as may be used in conventional fabrication of chips. After forming the bond pad 840, the method may include performing an additional annealing 842. Materials and various processes of depositing, forming, opening vias, patterning, etching, and/or performing CMP may be similar to those described in FIG. 5.

The various structures and methods disclosed in this patent document provide advantages over the prior art, whether standalone or combined. For example, the ATP layer may be deposited between the MTJ layer and the underlying dielectric layer to improve the surface smoothness for MTJ deposit and adhesion between the MTJ layer and dielectric layer. Further, the use of forming gas annealing in various stages of the fabrication process may resolve some or all issues of warpage, local topography, stress and adjustable thermal treatment by allowing the fabrication to operate in a lower temperature than that used in making the transistors of the processing unit.

Other advantages can be apparent to those skilled in the art from the foregoing specification. Accordingly, it will be recognized by those skilled in the art that changes or modifications may be made to the above-described embodiments without departing from the broad inventive concepts of the invention. It should therefore be understood that the present solution is not limited to the particular embodiments described herein, but is intended to include all changes, modifications, and all combinations of various embodiments that are within the scope and spirit of the invention as defined in the claims.

We claim:

1. A method of forming embedded memory in a processing unit, comprising:
   (i) depositing an dielectric layer on a metal landing pad of a logic circuit of a processing unit, the dielectric layer having a first surface;
   (ii) opening and filling in vias in the dielectric layer to form a second surface on top of the dielectric layer;
   (iii) performing chemical mechanical polishing (CMP) on the second surface using a high selectivity slurry until the first surface is exposed;
   (iv) depositing an adhesion and topography planarization (ATP) layer on the second surface;
   (v) etching away portions of the ATP layer;
   (vi) filling in with inter layer dielectric (ILD) materials to form a third surface on top of the ATP layer;
   (vii) performing CMP on the third surface until the second surface is exposed;
   (viii) depositing a magnetic tunnel junction (MTJ) film layer on the third surface;
   (ix) patterning and etching away portions of the MTJ film layer;

(x) filling in with dielectric materials to form a fourth surface on top of the MTJ film layer;
(xi) performing CMP on the fourth surface until the third surface is exposed; and
(xii) forming a bit line on the fourth surface.

2. The method of claim 1, further comprising:
depositing a passivation layer on the bit line;
forming a bond pad on the passivation layer; and
performing a first annealing after forming the bond pad.

3. The method of claim 1 further comprising annealing in a forming gas after step (i) and before step (ii).

4. The method of claim 1 further comprising annealing in a forming gas after step (iv) and before step (v).

5. The method of claim 1, wherein depositing the dielectric layer on the metal landing pad of the logic circuit comprises depositing SiCN, SiCN/SiO, SiCN/SiN or SiN/SiO.

6. The method of claim 5, wherein the dielectric layer has a thickness of 300 A to 3000 A.

7. The method of claim 1, wherein filling in the vias in the dielectric layer comprises depositing TiN, TaN, or Ta.

8. The method of claim 7, wherein filling in the vias comprises using PVD, CVD, or ALD.

9. The method of claim 1, wherein filling in the vias in the dielectric layer comprises forming a Cu single damascene to be in contact with at least a portion of the metal landing pad.

10. The method of claim 1, wherein the ATP layer comprises:
a first layer comprising WN, CrN, TiN, TaN, or NiCrN; and
a second layer comprising Ta, Nb, Ti, Zr, Hf, Mg, Cr, Zn, Al, TaN, W, or TiN.

11. The method of claim 1, wherein patterning and etching away the portions of the MTJ film layer comprises patterning a photoresist layer on the MTJ film layer and hard masking the photoresist layer to form a pattern comprising an array of MTJ elements, each element having a size.

12. The method of claim 11, wherein the array of MTJ elements comprises a plurality of sub-arrays of MTJ elements, each sub-array representing a type of MTJ elements and the sizes of the MTJ elements in at least two sub-arrays are different.

13. The method of claim 10, wherein etching away the portions of the MTJ film layer comprises using RIE with CH3OH, CO/NH3, CH3OH/Ar or CO/NH3/Ar chemistry, wherein the second layer of the ATP layer acts as an etch stop layer and comprises Ta, Nb, Ti, Zr, TaN or TiN.

14. The method of claim 10, wherein etching away the portions of the MTJ film layer comprises using Ar only plasma, or RIE and Ar only plasma etching, wherein the second layer of the ATP layer acts as an etch stop and comprises Ta, Nb, Ti, Zr, W, TaN or TiN.

15. The method of claim 10, wherein the ATP layer has a total thickness of 500 A to 4000 A.

16. The method of claim 1, wherein filing in the ATP film layer comprises depositing dielectric materials SiO, SiN, SiCN or a combination thereof.

17. The method of claim 16, wherein the dielectric materials have a thickness of 1000 A to 5000 A.

18. The method of claim 1, wherein forming the bit line comprises depositing an dielectric material layer and performing a Cu dual damascene processing on the dielectric material layer.

19. The method of claim 2, wherein a processing temperature of performing the first annealing is in a range of 200° C. to 400° C. and a duration of the first annealing is in a range of 30 minutes to 10 hours.

20. The method of claim 1, wherein the MTJ film comprises a free layer that comprises of $Co_xFe_yB_z$, $Fe_xB_y$, $Fe_xB_y/Co_xFe_yB_z$, $Co_xFe_yB_z/Co_xFe_yB_z$, $Co_xFe_yB_z/M/Co_xFe_yB_z$, $Fe_xB_y/M/Fe_xB_y$, or $Fe_xB_y/Co_xFe_yB_z/M/Co_xFe_yB_z$, wherein M is metal.

21. The method of claim 1, wherein the logic circuit of the processing unit is configured to use at least data read from the bit line to perform one or more convolution neural network computations.

22. The method of claim 1, wherein a processing temperature in performing (ii)-(xii) is in a range of greater than 200° C. and lower than 400° C.

23. A method of forming embedded memory in a processing unit, comprising:
depositing an dielectric layer on a metal landing pad of a logic circuit of a processing unit, the dielectric layer having a first surface;
opening vias in the dielectric layer;
filling in the vias in the dielectric layer to form a second surface on top of the dielectric layer;
performing chemical mechanical polishing (CMP) on the second surface using a high selectivity slurry until the first surface is exposed;
depositing a magnetic tunnel junction (MTJ) film layer on the second surface;
patterning and etching away portions of the MTJ film layer;
filling in with dielectric materials to form a third surface on top of the MTJ film layer;
performing CMP on the third surface until the second surface is exposed; and
forming a bit line on the fourth surface.

24. The method of claim 23, further comprising:
depositing a passivation layer on the bit line;
forming a bond pad on the passivation layer; and
annealing in a forming gas and performing an additional annealing.

25. A method of forming embedded memory in a processing unit, comprising:
(i) depositing an dielectric layer on a metal landing pad of a logic circuit of a processing unit, the dielectric layer having a first surface;
(ii) annealing in a forming gas;
(iii) opening vias in the dielectric layer;
(iv) filling in the vias in the dielectric layer to form a second surface on top of the dielectric layer;
(v) performing chemical mechanical polishing (CMP) on the second surface using a high selectivity slurry until the first surface is exposed;
(vi) depositing an adhesion and topography planarization (ATP) layer on the second surface;
(vii) depositing a magnetic tunnel junction (MTJ) film layer on the ATP layer;
(viii) patterning and etching away portions of the MTJ film layer through the ATP layer until the second surface;
(ix) filling in with dielectric materials to form a third surface a top surface of the MTJ film layer;
(x) performing CMP on the third surface until the top surface of the MTJ film layer is exposed; and
(xi) forming a bit line on the fourth surface.

26. The method of claim 25, further comprising:
depositing a passivation layer on the bit line;
forming a bond pad on the passivation layer; and
performing an additional annealing.

* * * * *